(12) United States Patent
Ootsuji

(10) Patent No.: US 6,614,251 B2
(45) Date of Patent: Sep. 2, 2003

(54) ELECTROMIGRATION EVALUATION CIRCUIT

(75) Inventor: Yuuichi Ootsuji, Kumamoto (JP)

(73) Assignee: NEC Electronics Corporation, Kawasaki (JP)

( * ) Notice: Subject to any disclaimer, the term of this patent is extended or adjusted under 35 U.S.C. 154(b) by 66 days.

(21) Appl. No.: 09/902,841

(22) Filed: Jul. 11, 2001

(65) Prior Publication Data

US 2002/0005731 A1 Jan. 17, 2002

(30) Foreign Application Priority Data

Jul. 12, 2000 (JP) .................................. 2000-211660

(51) Int. Cl.[7] .............................................. G01R 31/26
(52) U.S. Cl. .................................... 324/765; 324/158.1
(58) Field of Search .............................. 324/73.1, 763, 324/765, 158.1, 713, 718, 760, 537; 438/14, 17–18; 257/40, 48, 758; 714/728, 733, 731

(56) References Cited

U.S. PATENT DOCUMENTS 6,249,137 B1 * 6/2001 Krieger et al. .............. 324/765
6,320,391 B1 * 11/2001 Bui .............................. 324/537

FOREIGN PATENT DOCUMENTS

JP          11-026535        1/1999

* cited by examiner

*Primary Examiner*—Kamand Cuneo
*Assistant Examiner*—Minh N. Tang
(74) *Attorney, Agent, or Firm*—Katten Muchin Zavis Rosenman

(57) ABSTRACT

An electromigration evaluation circuit includes two transfer gates and two measurement terminals. The two measurement terminals are connected respectively to both ends of a to-be-evaluated device. In response to a control signal, each of the transfer gates is connected/disconnected to/from each of the measurement terminals. While performing a test for applying a load current to the to-be-evaluated device, the transfer gates are OFF, thereby electrically disconnecting the measurement terminals from the to-be-evaluated device. Just before or after the test, the transfer gates are ON, thereby electrically connecting the measurement terminals to the to-be-evaluated device. Then, the resistance of the to-be-evaluated device is obtained by an external measurement device. The resistance values which are obtained just before or after the test are compared with each other, so that electromigration resistance of the to-be-evaluated device can be evaluated.

15 Claims, 4 Drawing Sheets

ELECTROMIGRATION EVALUATION CIRCUIT

BACKGROUND OF THE INVENTION

1. Field of the Invention

The present invention relates to an electromigration evaluation circuit for use in evaluating electromigration resistance of a to-be-evaluated device.

2. Description of the Related Art

Electromigration (hereinafter referred to as EM) is a phenomenon wherein metal ions migrate as a result of an exchange of momentum between electrons and metal ions flowing to through a conductor. This EM phenomenon may occur, in a case where a current of a comparatively large current density flows to metal wiring of a semiconductor integrated circuit, etc., for a long time. If the EM phenomenon occurs, a problem is that the electric resistance of the metal wiring varies, and thus causing a breakage in the metal wiring.

To prevent such a problem, it is necessary to accurately evaluate the EM resistance of the metal wiring (hereinafter, referred to as a to-be-evaluated device) included in a semiconductor integrated circuit, etc. Various EM evaluation circuits and EM evaluation methods have conventionally been proposed. In load testing for applying a load current to the to-be-evaluated device, a DC (Direct Current), a unidirectional AC pulse current, a bidirectional AC pulse current, etc. can be used as the load current. An EM evaluation circuit for evaluating the EM resistance using a bidirectional AC pulse current is disclosed in Unexamined Japanese Patent Application KOKAI Publication No. H11-26535.

In this EM evaluation circuit, a plurality of transistors operate in response to a pulse voltage output by an oscillation circuit. Upon this, the bidirectional AC pulse current at the same frequency as that of the oscillation circuit flows to the to-be-evaluated device. If this pulse current flows to the to-be-evaluated device for a predetermined period of time, an EM phenomenon occurs, and the to-be-evaluated device is deteriorated, resulting in that the electric resistance value between both ends of the to-be-evaluated device varies. By obtaining the amount of the variation in the electric resistance value of the to-be-evaluated device, the EM resistance of the to-be-evaluated device can be evaluated. In order to achieve this, measurement terminals for measuring the electric resistance are connected respectively to both ends of the to-be-evaluated device.

Load currents flowing to the to-be-evaluated device are illustrated usually in the form of rectangular pulses, as shown in FIG. 3. However, if the frequency of such load currents is several hundred MHz, the waveform of the pulses is distorted, i.e. the deterioration of the waveform occurs, as shown in FIG. 4. This is because the parasitic capacity of several dozen pF at the measurement terminals connected to the to-be-evaluated device is charged with electricity or discharges. In the state where the waveform is being deteriorated, the current density of the load current gets lower. As a result of this, the value of the current density of the load current may become lower than a reference value which is set for the load testing. Furthermore, in the case where the waveform is extremely deteriorated, the value of the frequency of the load current may deviate from the value of the oscillation frequency. Accordingly, the EM evaluation circuit disclosed in the above publication has such a problem that the load testing is performed with low accuracy.

SUMMARY OF THE INVENTION

The present invention has been made in consideration of the above. It is accordingly an object of the present invention to provided an electromigration evaluation circuit which can eliminate the waveform of a load current from being deteriorated, during a test for evaluating electromigration resistance of a to-be-evaluated device.

Another object thereof is to provide an electromigration evaluation circuit which can accurately measure electromigration resistance of a to-be-evaluated device.

In order to achieve the above objects, according to the first aspect of the present invention, there is provided an electromigration evaluation circuit for use in evaluating electromigration resistance of a to-be-evaluated device, the circuit comprising:

two measurement terminals connected to both ends of the to-be-evaluated device;

a current applying circuit for applying a load current to the to-be-evaluated device; and two switch circuits for electrically connecting or disconnecting between the to-be-evaluated device and the two measurement terminals, in response to a predetermined control signal.

According to the above structure, while applying a load current to the to-be-evaluated device, the two terminals and the to-be-evaluated device can electrically be disconnected from each other, so that the parasitic capacity of the terminals are not effected by the load current. Alternatively, the two terminals and the to-be-evaluated device can be electrically connected with each other, so as to externally measure the physical characteristics of the to-be-evaluated device. In the simple structure of the electromigration evaluation circuit, the electromigration resistance of the to-be-evaluated device can be measured without any effect of the parasitic capacity at the terminals.

Each of the switch circuits may:

operate in accordance with a level of the predetermined control signal;

electrically disconnect the to-be-evaluated device from the two measurement terminals, in a case where a first control signal at a level representing that the current applying circuit applies a load current to the to-be-evaluated device is sent; and electrically connect the to-be-evaluated device with the measurement terminals, in a case where a second control signal at a level representing that electric characteristics of the to-be-evaluated device are measured is sent.

Each of the switch circuits may include a transfer gate having a current path, connected between the to-be-evaluated device and a corresponding one of the measurement terminals, and a control terminal to which the first or second control signal is applied.

The current applying circuit may include:

a pulse generator which generates a pulse signal;

a waveform adjustment circuit which adjusts a waveform of the generated pulse signal; and four transistor circuits each of which is connected to either end of the to-be-evaluated device, receives output signals respectively from the pulse generator and waveform adjustment circuit, and applies an alternating current to the to-be-evaluated device.

In order to achieve the above objects, according to the second aspect of the present invention, there is provided an electromigration evaluation circuit comprising:

a current applying circuit for applying a current between both ends of a to-be-evaluated device;

a first path one end of which is connected to one end of the to-be-evaluated device, and other end of which is connected to a first measurement terminal;

a second path one end of which is connected to other end of the to-be-evaluated device, and other end of which is connected to a second measurement terminal;

two switch circuits which intervene between the respective first and second paths; and a controller which controls the two switch circuits to electrically connect the first and second measurement terminals to the to-be-evaluated device, in a case where electric characteristics of the to-be-evaluated device are measured, and electrically disconnect the first and second measurement terminals from the to-be-evaluated device, in a case where the current applying circuit applies a current to the to-be-evaluated device.

The controller may generate a control signal for controlling operations of the switch circuits, and send the generated control signal thereto; and each of the switch circuits may electrically connect or disconnect each of the first and second measurement terminals to/from the to-be-evaluated device, in accordance with the sent control signal.

Each of the switch circuits may include a transfer gate having a current path, connected between the to-be-evaluated device and a corresponding one of the measurement terminals, and a control terminal to which the control signal is applied.

The current applying circuit may include:

a pulse generator for generating a pulse signal;

a waveform adjustment circuit for adjusting a waveform of the generated pulse signal; and four transistor circuits each of which is connected of either end of the to-be-evaluated device, receives output signals respectively from the pulse generator and waveform adjustment circuit, and applies an alternating current to the to-be-evaluated device.

In order to achieve the above objects, according to the third aspect of the present invention, there is provided a circuit comprising:

first and second measurement terminals;

first and second nodes between which a to-be-evaluated device is connected;

an AC circuit which is connected to the first and second nodes and flows current through said to-be-evaluated device; and a switch circuit which electrically connecting or disconnecting between said first measurement terminal and said first node and between said second measurement terminal and said second node.

The switch circuits may operate in accordance with a predetermined control signal;

electrically disconnects said to-be-evaluated device from said two measurement terminals, in a case where the predetermined control signal representing that said current applying circuit applies a load current to said to-be-evaluated device is sent; and electrically connects said to-be-evaluated device with said measurement terminals, in a case where the predetermined control signal representing that electric characteristics of said to-be-evaluated device are measured is sent.

The switch circuit may include: a transfer gate having a current path, connected between said to-be-evaluated device and a corresponding one of said measurement terminals, and a control terminal to which the first or second control signal is applied.

The current supplying circuit may include: a pulse generator which generates a pulse signal; a waveform adjustment circuit which adjusts a waveform of the generated pulse signal; and four transistor circuits each of which is connected to either end of said to-be-evaluated device, receives output signals respectively from said pulse generator and waveform adjustment circuit, and applies an alternating current to said to-be-evaluated device.

In order to achieve the above objects, according to the fourth aspect of the present invention, there is provided an electromigration determining method comprising:

providing a body having an element whose electromigration is to be determined, two externally accessable terminals, an externally controllable switch circuit provided between said element and two terminals, and an externally controllable current supplying circuit;

controlling the switch circuit to connect both ends of the element to the terminals;

measuring electrical characteristics of the element through the terminals to obtain a first measurement value;

controlling the switch circuit to disconnect both ends of the element from the terminals;

controlling the current supply circuit to supply current flow between both ends of the element;

controlling the switch circuit to connect both ends of the element to the terminals;

measuring electrical characteristics of the element through the terminals to obtain a second measurement value; and determining the electromigration of the element through the first and second measurement values.

The method may further comprises controlling the switch circuit and the current supplying circuit by supplying a control signal.

The controlling the current supply circuit comprises to supply rectangular AC wave current.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

Preferred embodiments of the present invention will now be explained with reference to the accompanying drawings.

Figure 1:
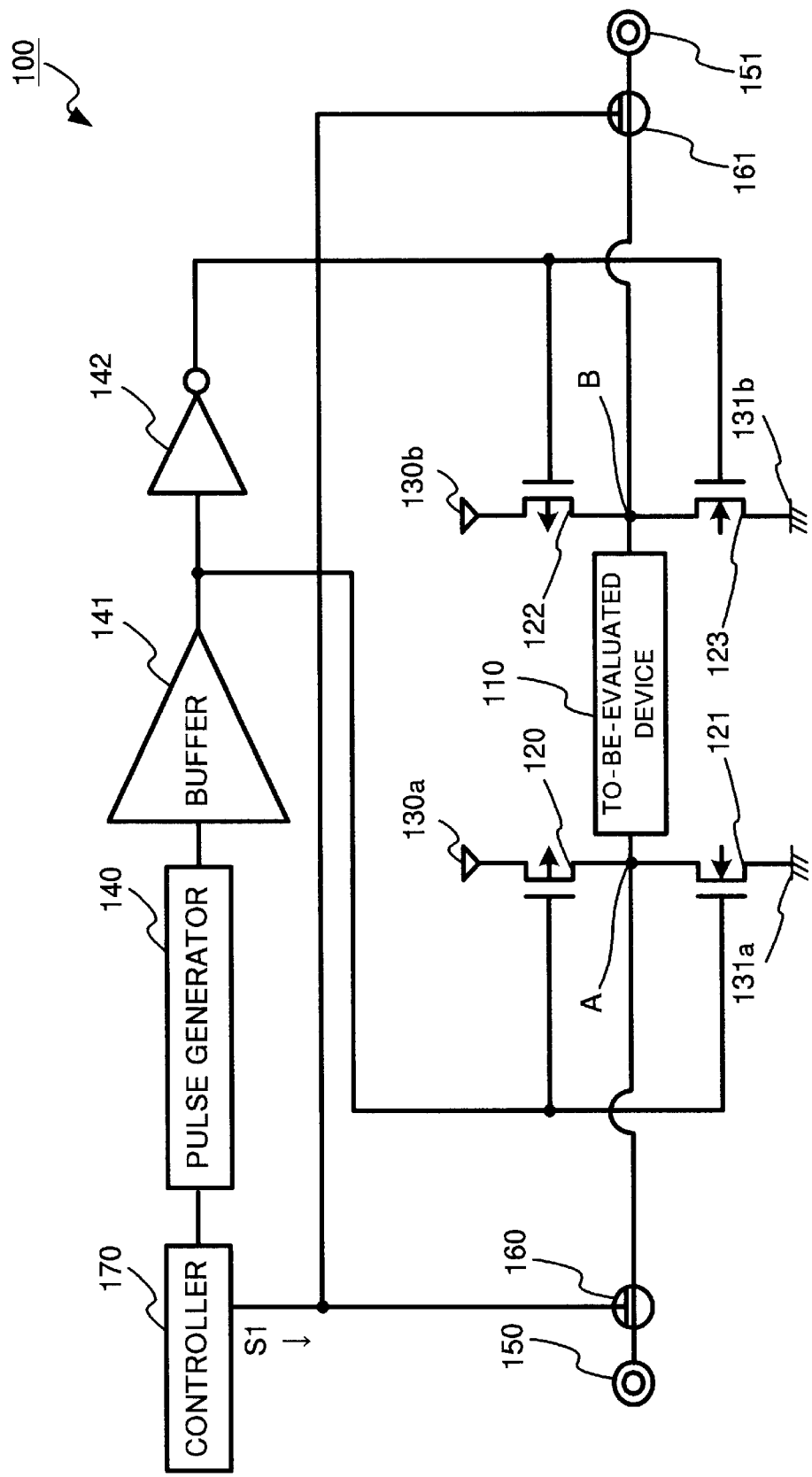
FIG. 1 is a block diagram showing the structure of an electromigration evaluation circuit according to the first embodiment of the present invention.

FIG. 1 is a block diagram showing the structure of an electromigration evaluation circuit (hereinafter, referred to as an EM evaluation circuit) 100 according to the first embodiment of the present invention.

The EM evaluation circuit 100 is for use in evaluating electromigration resistance (hereinafter, referred to as EM resistance) of a to-be-evaluated device 110. The to-be-evaluated device 110 includes metal wiring which is formed above a substrate of a semiconductor integrated circuit. If a current of high density flows to the to-be-evaluated device 110 for a predetermined period, the to-be-evaluated device 110 is deteriorated. As a result of this, the electric resistance of the to-be-evaluated device 110 varies. With reference to the amount of the variation in the electric resistance, the EM resistance can be evaluated. To accomplish the above, the EM evaluation circuit 100 includes a plurality of circuits for applying (supplying) a load current flowing to the to-be-evaluated device 110 and two measurement terminals for measuring the electric resistance value of the to-be-evaluated device 110.

As shown in FIG. 1, the EM evaluation circuit 100 comprises four transistors 120 to 123, a pulse generator 140, a buffer 141, an inverter 142, measurement terminals 150 and 151, transfer gates 160 and 161, and a controller 170.

Current paths of the respective transistors 120 and 121 are connected, as shown in FIG. 1, in series between a power source 130a and a ground power source 131a. Similarly, current paths of the respective transistors 122 and 123 are connected in series between a power source 130b and a ground power source 131b. The to-be-evaluated device 110 is connected between a node A for connecting the transistors 120 and 121 and a node B for connecting the transistors 122 and 123. Each of the transistors 120 and 122 includes a P-channel MOSFET (Metal Oxide Semiconductor Field Effect Transistor). Each of the transistors 121 and 123 includes an N-channel MOSFET.

The pulse generator 140 includes a PLL circuit (Phase-Locked Loop Circuit) or a ring oscillator, etc. The pulse generator 140 outputs a pulse voltage at a predetermined oscillation frequency.

The buffer 141 adjusts the voltage waveform of the pulse output by the pulse generator 140, and applies the voltage whose waveform has thus been adjusted to the gate of each of the transistors 120 and 121.

The inverter 142 inverts the level of the pulse output by the buffer 141, and applies this pulse to each of the transistors 122 and 123.

The measurement terminals 150 and 151 are connected respectively to both ends of the to-be-evaluated device 110, through the respective transfer gates 160 and 161. The measurement terminals 150 and 151 are to measure the electric resistance value of the to-be-evaluated device 110. More specifically, just before and after the time a load current is applied to the to-be-evaluated device 110, a probe of an external measurement device is connected to each of the measurement terminals 150 and 151, and each of the measurement terminals 150 and 151 measures the electric resistance value of the to-be-evaluated device 110, through thus connected probe.

Each of the transfer gates 160 and 161 includes a MOSFET, etc. A current path of the transfer gate 160 is connected between the measurement terminal 150 and the node A for connecting the transistors 120 and 121. A current path of the transfer gate 161 is connected between the measurement terminal 151 and the node B for connecting the transistors 122 and 123.

A control signal S1 is applied to a control terminal of each of the transfer gates 160 and 161, thereby to control ON/OFF of the transfer gates 160 and 161. When the transfer gates 160 and 161 are ON, the measurement terminals 150 and 151 are electrically connected to the to-be-evaluated device 110. When the transfer gates 160 and 161 are OFF, the measurement terminals 150 and 151 are electrically disconnected from the to-be-evaluated device 110. The ON resistance value of each of the transfer gates 160 and 161 is set equal to or lower than 1% of the resistance value of the to-be-evaluated device 110.

The controller 170 generates and outputs a signal for activating/inactivating the pulse generator 140 and a control signal S1 for controlling ON/OFF of the transfer gates 160 and 161.

Explanations will now be made to the flow of operations (1-1) of the EM evaluation circuit 100, operations (1-2) of the EM evaluation circuit 100 during load testing is performed, operations (1-3) of the EM evaluation circuit 100 just before or after the load testing is performed.

(1-1) Operations EM Evaluation Circuit 100

In the EM evaluation circuit 100, it is estimated how much the to-be-evaluated device 110 will get deteriorated upon reception of a load current, thereby to evaluate its EM resistance.

The EM evaluation circuit 100 obtains electric characteristics of the to-be-evaluated device 110, and applies a load current to the to-be-evaluated device 110 (performs load testing). After the load testing is performed, the EM evaluation circuit 100 obtains the electric characteristics of the to-be-evaluated device 110 again.

Before the load testing is performed, there is prepared a voltage measurement device, etc., separately from the EM evaluation circuit 100, and a probe of the voltage measurement device is connected to each of the measurement terminals 150 and 151, in advance. Then, the voltage measurement device applies a current for measurement to the to-be-evaluated device 110, so as to measure the voltage value between the measurement terminals 150 and 151.

The resistance value of the to-be-evaluated device 110 can be obtained, using the current for measurement and the measured voltage value.

The resistance values of the to-be-evaluated device 110 which are measured respectively before and after the load testing are compared with each other, thereby to evaluate the EM resistance of the to-be-evaluated device 110.

(1-2) Operations of EM Evaluations Circuit 100 When Load Testing is Performed Load testing is performed by applying a load current to the to-be-evaluated device 110 for a predetermined period, so as to give a stress to the to-be-evaluated device 110. The current density of the load current is set equal to or larger than a predetermined reference value.

During the load testing, the EM evaluation circuit 100 operates as follows:

The controller 170 supplies each of the transfer gates 160 and 161 with a control signal S1 at a non-active level. In response to this control signal S1, the transfer gates 160 and 161 are OFF. Then, the measurement terminals 150 and 151 are electrically disconnected from the to-be-evaluated device 110.

After this, the controller 170 controls the pulse generator 140 to output an AC pulse voltage (AC rectangular (or square) wave voltage) for a predetermined period. The buffer 141 adjusts the waveform of the output AC pulse voltage, and applies the voltage whose waveform is thus adjusted to the gate of each of the transistors 120 and 121. The inverter 142 inverts the level of the voltage applied by the buffer 141, and applies the output voltage to the gate of each of the transistors 122 and 123.

In response to the applied voltage, each of the transistors 120 to 123 is ON or OFF, as will be explained below.

For example, during the period the voltage output from the buffer 141 is at a low level, the transistors 120 and 123 are ON. Hence, a current flows from the power source 130*a* to the ground power source 131*b* through the nodes A and B. That is, a current flows to the to-be-evaluated device 110 in a direction from the node A to the node B.

During the period the voltage output from the buffer 141 is at a high level, the transistors 121 and 122 are ON. Then, a current flows from the power source 130*b* to the ground power source 131*a* through the nodes B and A. That is, a current flows to the to-be-evaluated device 110 in a direction from the node B to the node A.

Hence, an AC load current having the same cycle as the pulse cycle of the pulse generator 140 flows to the to-be-evaluated device 110.

After a predetermined period, the controller 170 inactivates the pulse generator 140, and hence completing the load testing. Since the transistors 120 to 123 are all OFF, no load current flows to the to-be-evaluated device 110.

(1-3) Operations of EM Evaluation Circuit 100 Just Before or After Load Testing Just before or after the load testing, the EM evaluation circuit 100 operates as follows:

The controller 170 supplies each of the transfer gates 160 and 161 with a control signal S1 at an active level. In response to this control signal S1, each of the transfer gates 160 and 161 is ON. Then, the measurement terminals 150 and 151 are electrically connected to the to-be-evaluated device 110.

The measured value, which has thus been obtained using the current for measurement and the measured voltage value, includes not only the resistance value of the to-be-evaluated device 110, but also the ON resistance value of the transfer gates 160 and 161. Since the ON resistance value of the transfer gates 160 and 161 is set equal to or lower than 1% of the resistance value of the to-be-evaluated device 110, resulting in the measurement error to be within an permissible range.

Figure 4:
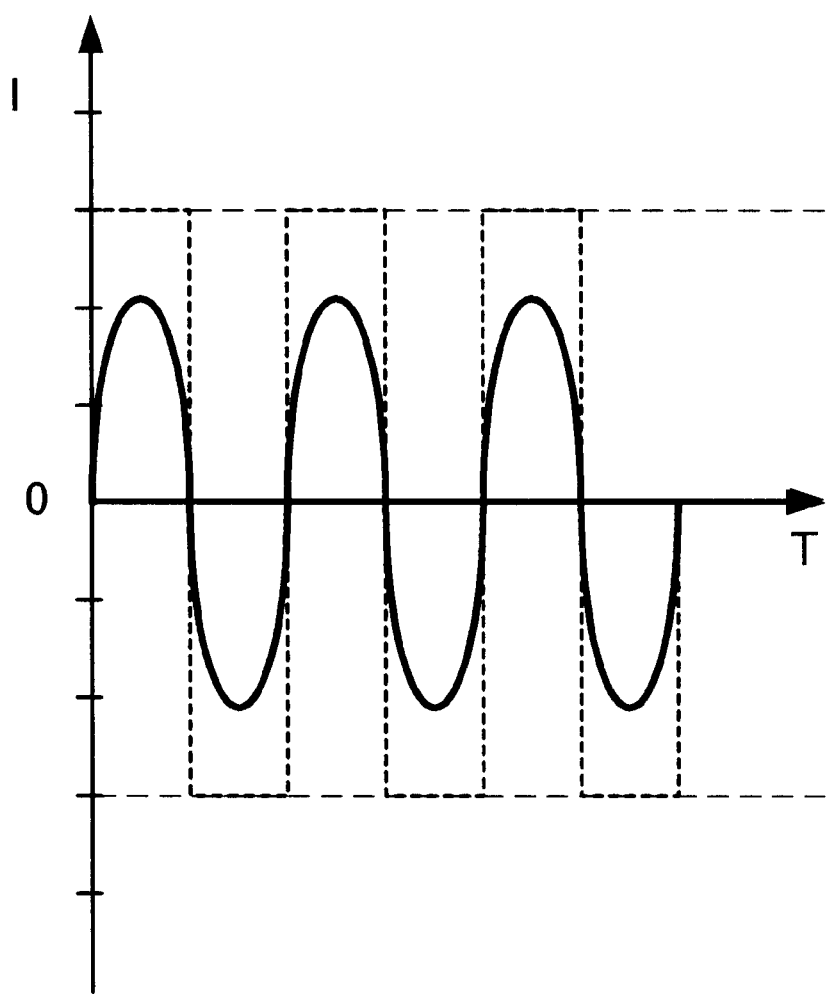
FIG. 4 is a diagram exemplifying a waveform distortion of a load current.

Suppose that the measurement terminals 150 and 151 are electrically connected to the to-be-evaluated device 110 during the load testing, the parasitic capacity at the measurement terminals 150 and 151 has an effect on the load current, and causes the waveform of the load current to be deteriorated (as shown in FIG. 4). However, as described in (1-1) to (1-3), according to this embodiment, the measurement terminals 150 and 151 are disconnected from the to-be-evaluated device 110 during the load testing. Hence, the waveform of the load current is unlikely to be deteriorated. In this EM evaluation circuit 100, the measurement terminals 150 and 151 and the to-be-evaluated device 110 are electrically connected with each other. In this structure, the resistance value of the to-be-evaluated device 110 can be measured with the utilization of the external measurement device. Accordingly, with such a simple structure of the EM evaluation circuit 100, the EM resistance of the to-be-evaluated device 100 can successfully be evaluated, without any effect of the parasitic capacity at the measurement terminals 150 and 151.

Second Embodiment

In the EM evaluation circuit 100 shown in FIG. 1, the resistance value of the to-be-evaluated device 110 is measured with relatively a low level of accuracy. This is because the measured resistance value of the to-be-evaluated device 110 includes the resistance values of the respective transfer gates 160 and 161. To overcome this problem, there is prepared an EM evaluation circuit according to the second embodiment of the present invention, as will now be explained.

Figure 2:
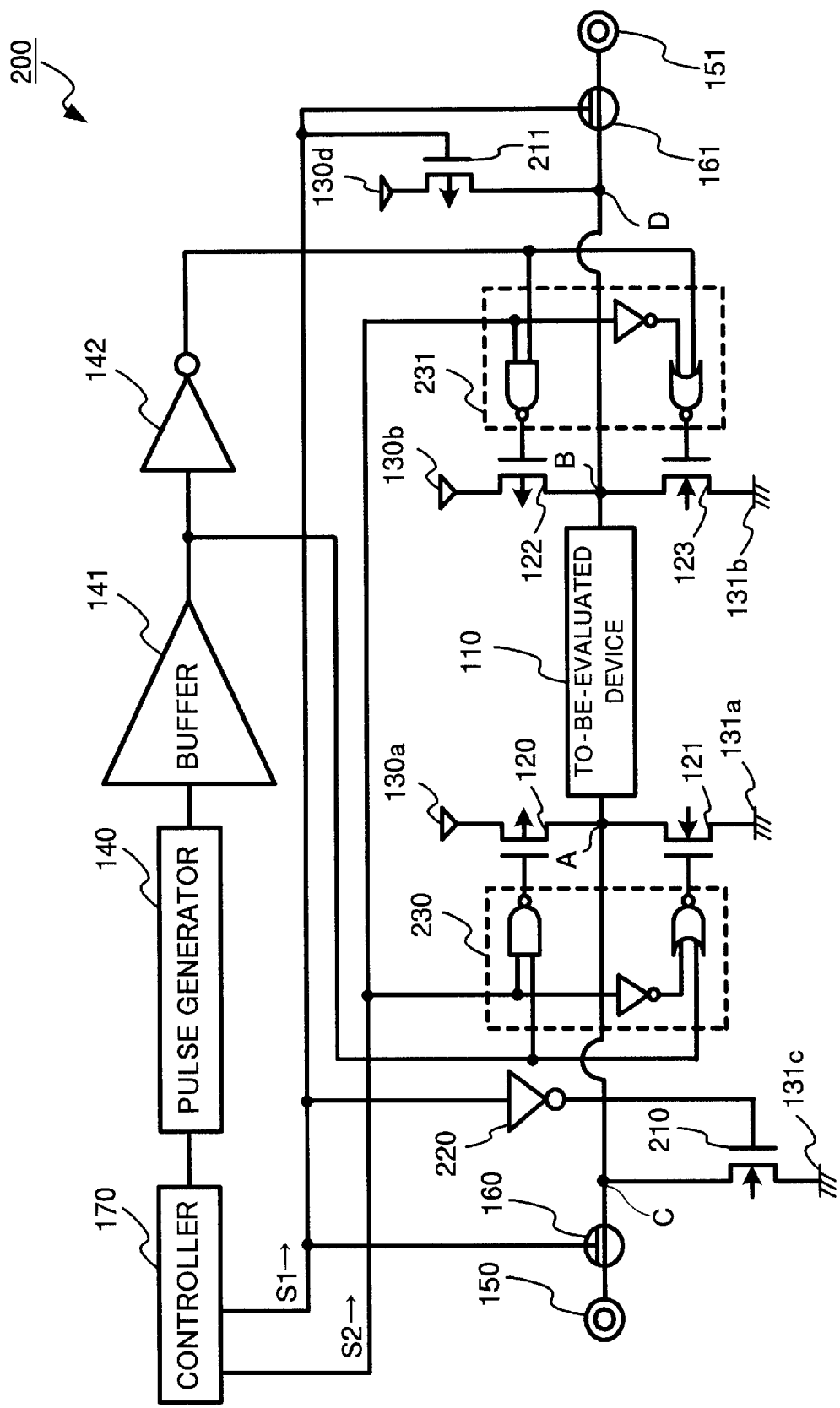
FIG. 2 is a block diagram showing the structure of an electromigration evaluation circuit according to the second embodiment of the present invention.
Figure 3:
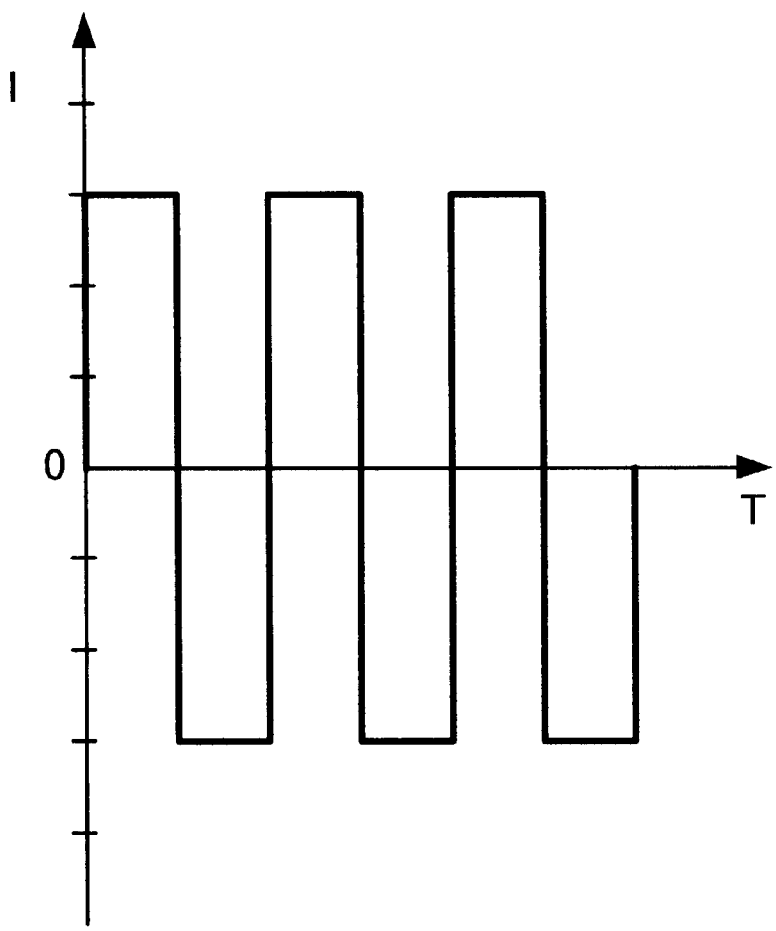
FIG. 3 is a diagram exemplifying a waveform of a load current.

FIG. 2 is a block diagram showing the structure of an EM evaluation circuit 200 according to the second embodiment. The same component elements of the EM evaluation circuit 200 as those of the EM evaluation circuit 100 are identified with the same reference numerals. The EM evaluation circuit 200 includes, in addition to the component elements of the EM evaluation circuit 100 of FIG. 1, transistors 210 and 211, an inverter 220, and gate circuits 230 and 231.

The transistor 210 includes an N-channel MOSFET. The source of the transistor 210 is connected to a ground power source 131*c*, and the drain thereof is connected to a node C for connecting the to-be-evaluated device 110 with the transfer gate 160. Applied to the gate of the transistor 210 is a signal as an inversion resultant signal of a control signal S1 inverted by the inverter 220.

The transistor 211 includes a P-channel MOSFET. The source of the transistor 211 is connected to a power source 130*d*, while the drain thereof is connected to a node D for connecting the to-be-evaluated device 110 and the transfer gate 161. Applied to the gate of the transistor 211 is a control signal S1.

Each of the gate circuits 230 and 231 is composed of an NAND circuit, a NOR circuit and an inverter.

Applied to the gate circuit 230 are an output signal of the buffer 141 and a control signal S2. In the case where the control signal S2 is at a high level, the gate circuit 230 applies an inversion resultant signal output from the buffer 141, to the gates of the respective transistors 120 and 121. In the case where the control signal is at a low level, the gate circuit 230 applies a high level signal to the gate of the transistor 120 and a low level signal to the gate of the transistor 121.

Applied to the gate circuit 231 are an output signal of the inverter 142 and a control signal S2. In the case where the control signal S2 is at a high level, the gate circuit 231 applies the output signal of the buffer 141 to the gates of the respective transistors 122 and 123. In the case where the control signal S2 is at a low level, the gate circuit 231 applies a high level signal to the gate of the transistor 122 and a low level signal to the gate of the transistor 123.

The controller 170 supplies the transistors 210 and 211 and the transfer gates 160 and 161 with a control signal S1. The controller 170 supplies the gate circuits 230 and 231 with an input control signal S2.

Explanations will now be made to a process for measuring the resistance value of the to-be-evaluated device 110 and operations of the EM evaluation circuit 200 of this embodiments. The process for evaluating the resistance value of the to-be-evaluated device 110 with the utilization of the EM evaluation circuit 200 is substantially the same as that of the first embodiment. Explanations will now be made to a process (2-1) for measuring an initial value of the resistance of the to-be-evaluated device 110, operations (2-2) of the EM evaluation circuit 200 during load testing, and a process (2-3) for measuring the resistance value of the to-be-evaluated device 110 again. (2-1) Process for Measuring Initial Value of Resistance of To-Be-Evaluated Device 110

During the process for measuring the initial value of resistance of the to-be-evaluated device 110, the EM evaluation circuit 200 operates as follow:

The controller 170 outputs a control signal S1 at an active level. In response to the control signal S1, the transfer gates 160 and 161 are ON, and the measurement terminals 150 and 151 are electrically connected to the to-be-evaluated device 110.

In response to the control signal S1, the transistor 210 and 211 are ON. As a result, current flows from the power source 130d to the ground power source 131c through the node D, to-be-evaluated device 110, and node C.

While this current flows, the probe of the external measurement device is connected to the measurement terminals 150 and 151, and the voltage value between the measurement terminals 150 and 151 is measured, thereby to successfully obtain the initial value of the resistance of the to-be-evaluated device 110.

(2-2) Operations of EM Evaluation Circuit 200 During Load Testing

Before proceeding load testing, the controller 170 outputs a control signal S1 at a on-active level. In response to this control signal S1, the transfer gates 160 and 161 are OFF, so that the measurement terminals 150 and 151 are electrically disconnected from the to-be-evaluated device 110. In response to this control signal S1, the transistor 210 and 211 are OFF.

The controller 170 outputs a control signal S2 at a high level. In response to this control signal S2, the gate circuits 230 and 231 are in an active state. In the case where the pulse voltage output by the buffer 141 is at a high level, the gate circuits 230 and 231 activate the transistors 121 and 122, and inactivate the transistors 120 and 123. As a result of this, a current flows from the power source 130b to the ground power source 131a through the nodes B and A. That is, a load current flows to the to-be-evaluated device 110 in a direction from the node B to the node A.

In the case where the pulse voltage output by the buffer 141 is at a low level, the gate circuits 230 and 231 activate the transistors 120 and 123, and inactivate the transistors 121 and 122. As a result of this, a current flows from the power source 130a to the ground power source 131b through the nodes A and B. That is, a load current flows to the to-be-evaluated device 110 in a direction from the node A to the node B.

In response to the outputs of the buffer 141 and inverter 142, the gate circuits 230 and 231 repeatedly perform the above operations, thereby an AC load current is supplied to the to-be-evaluated device 110.

After a predetermined period, the controller 170 inactivates the pulse generator 140 so as to complete the load testing, and further outputs a control signal S2 at a low level. In response to the output control signal S2, the gate circuits 230 and 231 are in a non-active state. Hence, the transistors 120 to 123 are all OFF, and the load current no longer flows to the to-be-evaluated device 110.

(2-3) Process for Measuring Resistance Value Again

After the load testing, the resistance value of the to-be-evaluated device 110 is measured again. Before measuring the resistance value, the controller 170 outputs a control signal S1 at an active level. In response to this control signal S1, the transfer gates 160 and 161 and the transistors 210 and 211 are all ON. Hence, in the EM valuation circuit 200, the measurement terminals 150 and 151 are electrically connected to the to-be-evaluated device 110. In addition, a current flows from the power source 130d to the ground power source 131c through the node D, to-be-evaluated device 110, and node C.

In this state, the voltage value between the measurement terminals 150 and 151 is measured so as to obtain the resistance value of the to-be-evaluated device 110, in accordance with the measurement process. This resistance value is compared with the initial value of the resistance of the to-be-evaluated device 110 which is obtained before the load testing, thereby to evaluate the EM resistance of the to-be-evaluated device 110.

As explained in (2-1) to (2-3), in the EM evaluation circuit 200 according to this embodiment, when the transfer gates 160 and 161 are ON, a current for measuring the resistance value of the to-be-evaluated device 110 flows. If this current flows between the node C and the measurement terminal 150 and between the node D and the measurement terminal 151, the ON resistance values of the respective transfer gates 160 and 161 are added to the measured value. However, in the EM evaluation circuit 200, when to measure the resistance value, no current flows to the current paths of the transfer gates 160 and 161. Thus, the ON resistance values of the transfer gates 160 and 161 has nothing to do with the measurement resultant value.

With the EM evaluation circuit 200 of this embodiment, the dimension of the transfer gates 160 and 161 can be reduced. As compared to the case of the EM evaluation circuit of FIG. 1, the variation in the resistance value of the to-be-evaluated device 110 can more accurately be measured.

To facilitate the measuring of such a variation in the resistance values obtained before and after the load testing, the resistance having approximately the same resistance value as that of the to-be-evaluated device 110 may be connected in such a position where the current for measurement flows, for example, between the transistor 211 and node D.

The present invention is not limited to the above-described embodiments, and various modifications and applications can be made. In this specification, for example, the load current flowing to the to-be-evaluated device is a bidirectional AC pulse current. However, the load current may be a unidirectional AC pulse current or DC (Direct Current).

Various embodiments and changes may be made thereonto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2000-211660 filed on Jul. 12, 2000, and including specification, claims, drawings and summary. The disclosure of the above Japanese Patent Application is incorporated herein by reference in its entirety.

What is claimed is:

1. An electromigration evaluation circuit for use in evaluating electromigration resistance of a to-be-evaluated device, said circuit comprising:
    two measurement terminals connected to both ends of said to-be-evaluated device;
    a current supplying circuit for supplying a load current to said to-be-evaluated device; and
    two switch circuits for electrically connecting or disconnecting between said to-be-evaluated device and said two measurement terminals, in response to a predetermined control signal, wherein each of said switch circuits:

operates in accordance with a level of said predetermined control signal;

electrically disconnects said to-be-evaluated device from said two measurement terminals, in a case where the predetermined control signal at a first level representing that said current supplying circuit supplies a load current to said to-be-evaluated device is sent; and electrically connects said to-be-evaluated device with said measurement terminals, in a case where the predetermined control signal at a second level representing that electric characteristics of said to-be-evaluated device are measured is sent.

2. The electromigration evaluation circuit according to claim 1, wherein each of said switch circuits includes:

a transfer gate having a current path, connected between said to-be-evaluated device and a corresponding one of said measurement terminals, and a control terminal to which the control signal of the first or second level is applied.

3. The electromigration evaluation circuit according to claim 1, wherein said current supplying circuit flows an AC rectangular wave current through the to-be-evaluated device.

4. The electromigration evaluation circuit according to claim 1, wherein said current supplying circuit includes:

a pulse generator which generates a pulse signal;

a waveform adjustment circuit which adjusts a waveform of the generated pulse signal; and four transistors each of which is connected to either end of said to-be-evaluated device, receives output signals respectively from said pulse generator and waveform adjustment circuit, and applies an alternating current to said to-be-evaluated device.

5. An electromigration evaluation circuit comprising:

a current supplying circuit for supplying a current between both ends of a to-be-evaluated device;

a first path one end of which is connected to one end of said to-be-evaluated device, and other end of which is connected to a first measurement terminal;

a second path one end of which is connected to other end of said to-be-evaluated device, and other end of which is connected to a second measurement terminal;

two switch circuits which intervene between said respective first and second paths; and a controller which controls said two switch circuits to electrically connect said first and second measurement terminals to said to-be-evaluated device, in a case where electric characteristics of said to-be-evaluated device are measured, and electrically disconnect said first and second measurement terminals from said to-be-evaluated device, in a case where said current supplying circuit applies a current to said to-be-evaluated device.

6. The electromigration evaluation circuit according to claim 5, wherein:

said controller generates a control signal for controlling operations of said switch circuits, and sends the generated control signal thereto; and each of said switch circuits electrically connects or disconnects each of said first and second measurement terminals to/from said to-be-evaluated device, in accordance with the sent control signal.

7. The electromigration evaluation circuit according to claim 5, wherein each of said switch circuits includes a transfer gate having a current path, connected between said to-be-evaluated device and a corresponding one of said measurement terminals, and a control terminal to which the control signal is applied.

8. The electromigration evaluation circuit according to claim 5, wherein said current supplying circuit includes:

a pulse generator for generating a pulse signal;

a waveform adjustment circuit for adjusting a waveform of the generated pulse signal; and four transistor circuits each of which is connected of either end of said to-be-evaluated device, receives output signals respectively from said pulse generator and waveform adjustment circuit, and applies an alternating current to said to-be-evaluated device.

9. A circuit comprising:

first and second measurement terminals;

first and second nodes between which a to-be-evaluated device is connected;

an AC circuit which is connected to the first and second nodes and flows current through said to-be-evaluated device; and switch circuits which electrically connect or disconnect between said first measurement terminal and said first node and between said second measurement terminal and said second node.

10. The circuit according to claim 9, wherein said switch circuits:

operate in accordance with a predetermined control signal;

electrically disconnect said to-be-evaluated device from said two measurement terminals, in a case where the predetermined control signal at a first control signal representing that said AC circuit supplies a load current to said to-be-evaluated device is sent; and electrically connect said to-be-evaluated device with said measurement terminals, in a case where the predetermined control signal at a second control signal representing that electric characteristics of said to-be-evaluated device are measured is sent.

11. The circuit according to claim 10, wherein each of said switch circuits includes:

a transfer gate having a current path, connected between said to-be-evaluated device and a corresponding one of said measurement terminals, and a control terminal to which the first or second control signal is applied.

12. The circuit according to claim 9, wherein said AC circuit includes:

a pulse generator which generates a pulse signal;

a waveform adjustment circuit which adjusts a waveform of the generated pulse signal; and four transistor circuits each of which is connected to either end of said to-be-evaluated device, receives output signals respectively from said pulse generator and waveform adjustment circuit, and applies an alternating current to said to-be-evaluated device.

13. An electromigration determining method comprising:

providing a body having an element whose electromigration is to be determined, two externally accessible terminals, externally controllable switch circuits provided between said element and two terminals, and an externally controllable current supplying circuit;

controlling the switch circuits to connect both ends of the element to the terminals;

measuring electrical characteristics of the element through the terminals to obtain a first measurement value;

controlling the switch circuits to disconnect both ends of the element from the terminals;

controlling the current supplying circuit to supply current flow between both ends of the element;

controlling the switch circuits to connect both ends of the element to the terminals;

measuring electrical characteristics of the element through the terminals to obtain a second measurement value; and determining the electromigration of the element through the first and second measurement values.

14. The method according to claim 12, further comprising controlling the switch circuits and the current supplying circuit by supplying a control signal.

15. The method according to claim 14, wherein said controlling the current supplying circuit comprises supplying rectangular wave current.

* * * * *